United States Patent
Moore et al.

(10) Patent No.: US 7,153,410 B2
(45) Date of Patent: Dec. 26, 2006

(54) METHODS AND APPARATUS FOR ELECTROCHEMICAL-MECHANICAL PROCESSING OF MICROELECTRONIC WORKPIECES

(75) Inventors: Scott E. Moore, Meridian, ID (US); Whonchee Lee, Boise, ID (US); Scott G. Meikle, Boise, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 10/090,869

(22) Filed: Mar. 4, 2002

(65) Prior Publication Data

US 2003/0226764 A1 Dec. 11, 2003

Related U.S. Application Data

(63) Continuation-in-part of application No. 09/888,084, filed on Jun. 21, 2001, and a continuation-in-part of application No. 09/887,767, filed on Jun. 21, 2001, and a continuation-in-part of application No. 09/651,779, filed on Aug. 30, 2000.

(51) Int. Cl.
*C25F 7/00* (2006.01)
*C25F 3/00* (2006.01)

(52) U.S. Cl. ............... 205/658; 204/286.1; 204/298.08; 204/298.28; 204/242; 204/224 R; 204/224 M; 204/212; 204/230.2; 205/659; 205/663

(58) Field of Classification Search ............... 204/212, 204/224 R, 224 M, 230.2, 286.1, 298.08, 204/298.28, 242, 192.25, 406, 196.02, 196.03, 204/228.1, 229.4, 229.5, 230.5, 230.7; 205/658–659, 205/663, 123, 641, 646, 205, 206, 662, 687, 205/219, 686

See application file for complete search history.

(56) References Cited

U.S. PATENT DOCUMENTS

| | | | |
|---|---|---|---|
| 2,315,695 A | 4/1943 | Faust | |
| 2,516,105 A | 7/1950 | der Mateosian | |

(Continued)

FOREIGN PATENT DOCUMENTS

EP 0459397 A3 12/1991

(Continued)

OTHER PUBLICATIONS

U.S. Appl. No. 09/651,779, filed Aug. 30, 2000, Moore.

(Continued)

*Primary Examiner*—Roy King
*Assistant Examiner*—Lois Zheng
(74) *Attorney, Agent, or Firm*—Perkins Coie LLP

(57) ABSTRACT

Methods and apparatuses for electrochemical-mechanical processing of microelectronic workpieces. One embodiment of an electrochemical processing apparatus in accordance with the invention comprises a workpiece holder configured to receive a microelectronic workpiece, a workpiece electrode, a first remote electrode, and a second remote electrode. The workpiece electrode is configured to contact a processing side of the workpiece when the workpiece is received in the workpiece holder. The first and second remote electrodes are spaced apart from the workpiece holder. The apparatus can also include an AC power supply, a DC power supply, and a switching assembly. The switching assembly is coupled to the workpiece electrode, the first remote electrode, the second remote electrode, the AC power supply, and the DC power supply. In operation, the switching assembly couples the AC power supply and/or the DC power supply to the workpiece electrode, the first remote electrode, and/or the second remote electrode for plating, deplating and/or mechanically removing material.

42 Claims, 6 Drawing Sheets

U.S. PATENT DOCUMENTS

| | | | |
|---|---|---|---|
| 3,239,439 A * | 3/1966 | Helmke | 205/205 |
| 3,334,210 A | 8/1967 | Williams et al. | |
| 4,839,005 A | 6/1989 | Katsumoto et al. | |
| 5,098,533 A | 3/1992 | Duke et al. | |
| 5,162,248 A | 11/1992 | Dennison et al. | |
| 5,244,534 A | 9/1993 | Yu et al. | |
| 5,300,155 A | 4/1994 | Sandhu et al. | |
| 5,344,539 A | 9/1994 | Shinogi et al. | |
| 5,562,529 A | 10/1996 | Kishii et al. | |
| 5,567,300 A | 10/1996 | Datta et al. | |
| 5,575,885 A | 11/1996 | Hirabayashi et al. | |
| 5,618,381 A | 4/1997 | Doan et al. | |
| 5,624,300 A | 4/1997 | Kishii et al. | |
| 5,676,587 A | 10/1997 | Landers et al. | |
| 5,681,423 A | 10/1997 | Sandhu et al. | |
| 5,780,358 A | 7/1998 | Zhou et al. | |
| 5,807,165 A | 9/1998 | Uzoh et al. | |
| 5,840,629 A | 11/1998 | Carpio | |
| 5,843,818 A | 12/1998 | Joo et al. | |
| 5,846,398 A | 12/1998 | Carpio | |
| 5,863,307 A | 1/1999 | Zhou et al. | |
| 5,888,866 A | 3/1999 | Chien | |
| 5,897,375 A | 4/1999 | Watts et al. | |
| 5,911,619 A * | 6/1999 | Uzoh et al. | 451/5 |
| 5,930,699 A | 7/1999 | Bhatia | |
| 5,934,980 A | 8/1999 | Koos et al. | |
| 5,952,687 A | 9/1999 | Kawakubo et al. | |
| 5,954,975 A | 9/1999 | Cadien et al. | |
| 5,954,997 A | 9/1999 | Kaufman et al. | |
| 5,972,792 A | 10/1999 | Hudson | |
| 5,993,637 A * | 11/1999 | Hisamatsu et al. | 205/652 |
| 6,001,730 A | 12/1999 | Farkas et al. | |
| 6,007,695 A | 12/1999 | Knall et al. | |
| 6,010,964 A | 1/2000 | Glass | |
| 6,024,856 A | 2/2000 | Haydu et al. | |
| 6,033,953 A | 3/2000 | Aoki et al. | |
| 6,039,633 A | 3/2000 | Chopra | |
| 6,046,099 A | 4/2000 | Cadien et al. | |
| 6,051,496 A | 4/2000 | Jang | |
| 6,060,386 A | 5/2000 | Givens | |
| 6,060,395 A | 5/2000 | Skrovan et al. | |
| 6,063,306 A | 5/2000 | Kaufman et al. | |
| 6,066,030 A | 5/2000 | Uzoh | |
| 6,066,559 A | 5/2000 | Gonzalez et al. | |
| 6,068,787 A | 5/2000 | Grumbine et al. | |
| 6,083,840 A | 7/2000 | Mravic et al. | |
| 6,100,197 A | 8/2000 | Hasegawa | |
| 6,103,096 A | 8/2000 | Datta et al. | |
| 6,103,628 A | 8/2000 | Talieh | |
| 6,103,636 A | 8/2000 | Zahorik et al. | |
| 6,115,233 A | 9/2000 | Seliskar et al. | |
| 6,117,781 A | 9/2000 | Lukanc et al. | |
| 6,121,152 A | 9/2000 | Adams et al. | |
| 6,132,586 A | 10/2000 | Adams et al. | |
| 6,143,155 A | 11/2000 | Adams et al. | |
| 6,162,681 A | 12/2000 | Wu | |
| 6,171,467 B1 | 1/2001 | Weihs et al. | |
| 6,174,425 B1 | 1/2001 | Simpson et al. | |
| 6,176,992 B1 | 1/2001 | Talieh | |
| 6,180,947 B1 | 1/2001 | Stickel et al. | |
| 6,187,651 B1 | 2/2001 | Oh | |
| 6,190,494 B1 | 2/2001 | Dow | |
| 6,196,899 B1 | 3/2001 | Chopra et al. | |
| 6,197,182 B1 | 3/2001 | Kaufman et al. | |
| 6,206,756 B1 | 3/2001 | Chopra et al. | |
| 6,218,309 B1 | 4/2001 | Miller et al. | |
| 6,250,994 B1 | 6/2001 | Chopra et al. | |
| 6,259,128 B1 | 7/2001 | Adler et al. | |
| 6,273,786 B1 | 8/2001 | Chopra et al. | |
| 6,276,996 B1 | 8/2001 | Chopra | |
| 6,280,581 B1 | 8/2001 | Cheng | |
| 6,287,974 B1 | 9/2001 | Miller | |
| 6,299,741 B1 | 10/2001 | Sun et al. | |
| 6,303,956 B1 | 10/2001 | Sandhu et al. | |
| 6,313,038 B1 | 11/2001 | Chopra et al. | |
| 6,322,422 B1 | 11/2001 | Satou | |
| 6,328,632 B1 | 12/2001 | Chopra | |
| 6,368,184 B1 | 4/2002 | Beckage | |
| 6,368,190 B1 | 4/2002 | Easter et al. | |
| 6,379,223 B1 | 4/2002 | Sun et al. | |
| 6,395,607 B1 | 5/2002 | Chung | |
| 6,416,647 B1 * | 7/2002 | Dordi et al. | 205/137 |
| 6,433,929 B1 | 8/2002 | Sasaki | |
| 6,455,370 B1 | 9/2002 | Lane | |
| 6,461,911 B1 | 10/2002 | Ahn et al. | |
| 6,464,855 B1 | 10/2002 | Chadda et al. | |
| 6,504,247 B1 | 1/2003 | Chung | |
| 6,620,037 B1 | 9/2003 | Kaufman et al. | |
| 6,689,258 B1 | 2/2004 | Lansford et al. | |
| 6,693,036 B1 | 2/2004 | Nogami et al. | |
| 6,722,942 B1 | 4/2004 | Lansford et al. | |
| 6,736,952 B1 | 5/2004 | Emesh et al. | |
| 6,753,250 B1 | 6/2004 | Hill et al. | |
| 6,776,693 B1 | 8/2004 | Duboust et al. | |
| 6,780,772 B1 | 8/2004 | Uzoh et al. | |
| 6,848,970 B1 | 2/2005 | Manens et al. | |
| 6,852,630 B1 | 2/2005 | Basol et al. | |
| 6,867,136 B1 | 3/2005 | Basol et al. | |
| 6,881,664 B1 | 4/2005 | Catabay et al. | |
| 6,893,328 B1 | 5/2005 | So | |
| 2001/0025976 A1 | 10/2001 | Lee | |
| 2001/0036746 A1 | 11/2001 | Sato et al. | |
| 2002/0052126 A1 | 5/2002 | Lee et al. | |
| 2002/0070126 A1 | 6/2002 | Sato et al. | |
| 2002/0104764 A1 | 8/2002 | Banerjee et al. | |
| 2002/0115283 A1 | 8/2002 | Ho et al. | |
| 2003/0064669 A1 | 4/2003 | Basol et al. | |
| 2003/0178320 A1 | 9/2003 | Liu et al. | |
| 2004/0192052 A1 | 9/2004 | Mukherjee et al. | |
| 2004/0259479 A1 | 12/2004 | Sevilla | |
| 2005/0059324 A1 | 3/2005 | Lee et al. | |
| 2005/0133379 A1 | 6/2005 | Basol et al. | |
| 2005/0173260 A1 | 8/2005 | Basol et al. | |
| 2005/0178743 A1 | 8/2005 | Manens et al. | |

FOREIGN PATENT DOCUMENTS

| | | |
|---|---|---|
| EP | 0459397 A2 | 12/1991 |
| EP | 1 123 956 A1 | 8/2001 |
| JP | 1-241129 A | 9/1989 |
| JP | 2001077117 A1 | 3/2001 |
| WO | WO 00/26443 | 5/2000 |
| WO | WO 00/28586 | 5/2000 |
| WO | WO 00/32356 | 6/2000 |
| WO | WO 00/59008 | 10/2000 |
| WO | WO 00/59682 | 10/2000 |
| WO | WO 02/064314 A1 | 8/2002 |

OTHER PUBLICATIONS

U.S. Appl. No. 09/651,808, filed Aug. 30, 2000, Chopra et al.

U.S. Appl. No. 09/653,392, filed Aug. 31, 2000, Chopra et al.

U.S. Appl. No. 09/887,767, filed Jun. 21, 2001, Lee et al.

U.S. Appl. No. 09/888,002, filed Jun. 21, 2001, Lee et al.

U.S. Appl. No. 09/888,084, filed Jun. 21, 2001, Lee et al.

U.S. Appl. No. 10/230,463, filed Aug. 29, 2002, Lee et al.

U.S. Appl. No. 10/230,602, filed Aug. 29, 2002, Chopra.

U.S. Appl. No. 10/230,628, filed Aug. 29, 2002, Lee et al.

U.S. Appl. No. 10/230,970, filed Aug. 29, 2002, Lee et al.

U.S. Appl. No. 10/230,972, filed Aug. 29, 2002, Lee et al.

U.S. Appl. No. 10/230,973, filed Aug. 29, 2002, Lee et al.

Frankenthal, R.P. and Eaton, D.H., "Electroetching of Platinum in the Titanium–Platinum–Gold Metallization on Silicon Integrated Circuits," *Journal of The Electrochemical Society*, vol. 123, No. 5, pp. 703–706, May 1976.

Bernhardt, A.F., Contolini, R.J., Mayer, S.T., "Electrochemical Planarization for Multi–Level Metallization of Microcircuitry," *CircuiTree Journal*, vol. 8, No. 10, pp. 38, 40, 42, 44, 46, 48, Oct 1995.

McGraw–Hill, *Concise Encyclopedia of Science & Technology*, Sybil P. Parker, Editor in Chief, Fourth Edition, p. 367, McGraw–Hill, New York, New York, 1998, no month.

Huang, C.S. et al., "A Novel UV Baking Process to Improve DUV Photoresist Hardness," 1999 International Symposium on VLSI Technology, Systems, and Applications: Proceedings of Technical Papers: Jun. 8–10, 1999, Taipei, Taiwan, pp. 135–138, IEEE, Aug. 1, 1999.

ATMI, Table of Contents, Adapted from a presentation at the Semicon West '99 Low Dielectric Materials Technology Conference, Jul. 12, 1999, pp. 13–25.

Kondo, S. et al., "Abrasive–Free Polishing for Copper Damascene Interconnection," *Journal of the Electrochemical Society*, 147(10), pp. 3907–3913 (2000), no month.

Micro Photonics, Inc., CSM Application Bulletin, "Low-–load Micro Scratch Tester (MST) for characterisation of thin polymer films," http://www.microphotonics.com/mstABpoly.html, Jul. 25, 2002, 3 pages.

Micro Photonics, Inc., "CSM Nano Hardness Tester," http://www.microphotonics.com/nht.html, Jul. 29, 2002, 6 pages.

PhysicsWorld—Table of Contents, PhysicsWeb, "Hard Materials," http://physicsweb.org/box/world/11/1/11/world–11–1–11–1, Jul. 29, 2002, 1 page.

PCT Written Opinion dated Jun. 10, 2003 for PCT/US02/19495 filed Jun. 20, 2002 (7 pages).

PCT Written Opinion dated Jun. 10, 2003 for PCT/US02/19496 filed Jun. 20, 2002 (8 pages).

PCT International Search Report dated Mar. 31, 2003 for PCT/US02/19495 filed Jun. 20, 2002 (6 pages).

PCT International Search Report dated Apr. 4, 2003 for PCT/US02/19496 filed Jun. 20, 2002 (3 pages).

PCT International Search Report dated Jul. 10, 2003 for PCT/US03/06373 filed Feb. 28, 2003 (4 pages).

D'Heurle, F.M. and K.C. Park, IBM Technical Disclosure Bulletin, Electrolytic Process for Metal Pattern Generation, vol. 17, No. 1, pp. 271–272, Jun. 1974, XP–002235691, NN 7406271.

Aboaf, J.A. and R.W. Broadie, IBM Technical Disclosure Bulletin, Rounding of Square–Shape Holes in Silicon Wafers, vol. 19, No. 8, p. 3042, Jan. 1977, XP–002235690, NN 77013042.

Bassous, E., IBM Technical Disclosure Bulletin, Low Temperature Methods for Rounding Silicon Nozzles, vol. 20, No. 2, Jul. 1977, pp. 810–811, XP–002235692, NN 7707810.

Juchniewicz, R. et al. "Influence of Pulsed Current of Platinised Titanium and Tantalum Anode Durability," International Congress of Metallic Corrosion, Proceedings—vol. 3, pp. 449–453, Toronto, Jun. 3–7, 1984.

PCT International Search Report dated Dec. 15, 2003 for PCT/US03/27181 filed Aug. 27, 2003 (7 pages).

* cited by examiner

METHODS AND APPARATUS FOR ELECTROCHEMICAL-MECHANICAL PROCESSING OF MICROELECTRONIC WORKPIECES

CROSS-REFERENCE TO RELATED APPLICATION(S)

The present application is a continuation-in-part of U.S. application Ser. No. 09/651,779, filed Aug. 30, 2000 and entitled "Methods and Apparatus for Removing Conductive Material from a Microelectronic Substrate;" U.S. application Ser. No. 09/888,084, filed Jun. 21, 2001, and entitled "Methods and Apparatus for Electrical, Mechanical and/or Chemical Removal of Conductive Material from a Microelectronic Substrate;" and U.S. application Ser. No. 09/887,767, filed Jun. 21, 2001, and entitled "Microelectronic Substrate Having Conductive Material With Blunt-Cornered Apparatus, and Associated Methods for Removing Conductive Material;" all of which are herein incorporated in their entirety by reference.

TECHNICAL FIELD

The following disclosure relates to methods and apparatuses for plating and removing materials from microelectronic workpieces using electrochemical-mechanical processes.

BACKGROUND

Microelectronic workpieces typically include a substrate that has a plurality of components, such as memory cells, that are interconnected with conductive lines and other features. The conductive lines can be formed by forming trenches or other recesses in the workpiece and then depositing a conductive material or other compound in the trenches. The overburden of the conductive materials, which is the portion of the conductive material above the trenches, is then removed to leave discrete lines of conductive material in the trenches.

Electrochemical processes have been used to both deposit and remove metal layers. A typical electrochemical plating process involves depositing a seed layer onto the surface of the workpiece using chemical vapor deposition (CVD), physical vapor deposition (PVD), or other suitable processes. After forming the seed layer, a blanket layer or patterned layer of metal is plated onto the workpiece by applying an appropriate electrical potential between the seed layer and an electrode in the presence of an electroprocessing solution (e.g., an electrolytic solution). For most metals, a cathode is coupled to the seed layer and an anode is immersed in the electroprocessing solution to establish an electrical field between the seed layer and the anode.

Electroprocessing techniques have also been used to remove metal layers from microelectronic workpieces. For example, an anode can be coupled to a metal layer on a workpiece and a cathode can be immersed in an electrolytic solution to remove metal from the surface of the workpiece. In another example, an alternating current can be applied to a conductive layer through an electrolyte to remove portions of the metal. For example, FIG. 1 illustrates a conventional apparatus 60 for removing metal using an alternating current that includes a first electrode 20a and a second electrode 20b coupled to a current source 21. The first electrode 20a is attached directly to a metallic layer 11 on a semiconductor substrate 10, and the second electrode 20b is at least partially immersed in a liquid electrolyte 31 disposed on the surface of the metallic layer 11. The second electrode 20b, for example, can be moved downwardly until it contacts the electrolyte 31. A barrier 22 protects the first electrode 20a from directly contacting the electrolyte 31. The current source 21 applies alternating current to the substrate 10 via the first electrode 20a, the second electrode 20b, and the electrolyte 31 to remove conductive material from the metallic layer 11. The alternating current signal can have a variety of wave forms, such as those disclosed by Frankenthal et al., "Electroetching of Platinum in the Titanium-Platinum-Gold Metallization on Silicon Integrated Circuits" (Bell Laboratories), which is incorporated herein in its entirety by reference.

One drawback with the system shown in FIG. 1 is that it may not be possible to remove material from the conductive layer 11 in the region where the first electrode 20a is attached to the substrate 10 because the barrier 22 prevents the electrolyte 31 from contacting the substrate 10 in this region. Alternatively, if the first electrode 20a is a consumable electrode in contact with the electrolyte, the electrolytic process can degrade the first electrode 20a. Still a further drawback is that the electrolytic process may not uniformly remove material from the substrate 10. For example, discrete areas of residual conductive material having no direct electrical connection to the first electrode 20a (e.g., "islands") may develop in the conductive layer 11. The discrete areas of residual conductive material can interfere with the formation and/or operation of the conductive lines, and it may be difficult to remove such residual material with the electrolytic process unless the first electrode 20a is repositioned to be coupled to such "islands."

One approach to mitigate some of the foregoing drawbacks is to attach a plurality of first electrodes 20a around the periphery of the substrate 10 to increase the uniformity with which the conductive material is removed. However, discrete areas of residual conductive material may still remain despite the additional number of electrodes that contact the substrate 10. Another approach is to form the electrodes 20a and 20b from an inert material, such as carbon, so that the barrier 22 is not required. Although this allows more area of the conductive layer 11 to be in contact with the electrolyte 31, inert electrodes may not be as effective as more reactive electrodes (i.e., consumable electrodes) at removing the conductive material. As a result, inert electrodes may still leave residual conductive material on the substrate 10.

FIG. 2 shows another approach to mitigate some of the foregoing drawbacks in which two substrates 10 are partially immersed in a vessel 30 containing the electrolyte 31. The first electrode 20a is attached to one substrate 10 and the second electrode 20b is attached to the other substrate 10. An advantage of this approach is that the electrodes 20a and 20b do not contact the electrolyte. However, islands of conductive material may still remain after the electrolytic process is complete, and it may be difficult to remove conductive material from the points at which the electrodes 20a and 20b are attached to the substrates 10.

International Application PCT/US00/08336 (published as WO/00/59682) discloses an apparatus having a first chamber for applying a conductive material to a semiconductor wafer, and a second chamber for removing conductive material from the semiconductor wafer by electropolishing or chemical-mechanical polishing. The second chamber includes an anode having a paint roller configuration with a cylindrical mechanical pad that contacts both an electrolyte bath and the face of the wafer as the anode and the wafer rotate about perpendicular axes. A cathode, which can include a conductive liquid isolated from the electrolytic bath, is electrically coupled to an edge of the wafer. One drawback with this device is that is, too, can leave islands of residual conductive material on the wafer.

Another existing device is disclosed in U.S. Pat. No. 6,176,992 B1 owned by Nutool of California. This patent discloses an electrochemical-deposition machine having a first electrode contacting a processing side of a wafer, a polishing pad engaging another portion of the processing side of the wafer, and a second electrode underneath the polishing pad. An electrolyte is passed through the polishing pad in contact with the first electrode, the second electrode, and the face of the wafer. During a plating cycle, a direct current is passed through the first and second electrodes to plate metal ions onto the face of the wafer. During a deplating/planarizing cycle, the polarity of the direct current is switched to deplate metal from the wafer while the polishing pad rubs against the face of the wafer.

One concern of the device disclosed in U.S. Pat. No. 6,176,992 is that the deplating/planarizing cycle may remove material much faster at the perimeter of the wafer than at the center of the wafer. More specially, as the deplating/planarizing cycle progresses, the overburden across the wafer becomes very thin such that a significant voltage drop occurs between the perimeter and the center of the wafer. This voltage drop causes more material to deplate from the perimeter of the wafer than from the center of the wafer. Additionally, the direct current can form a passivation layer on the surface of the metal that exacerbates the voltage drop. This phenomena is particularly problematic for processing large wafers (e.g., 300 mm) because the large diameter of these wafers produces a larger voltage drop. Therefore, it would be desirable to more uniformly remove material from the face of the wafer.

SUMMARY

The present invention is directed towards methods and apparatuses for electrochemical-mechanical processing of microelectronic workpieces. The term "microelectronic workpiece" is used throughout to include a workpiece formed from a substrate upon which and/or in which microelectronic circuits or many other components are fabricated (e.g., data storage elements, interconnect features, transistors, and/or micro-mechanical elements, etc.). One embodiment of an electrochemical processing apparatus in accordance with the invention comprises a workpiece holder configured to receive a microelectronic workpiece, a workpiece electrode, a first remote electrode, and a second remote electrode. The workpiece electrode is configured to contact a processing side of the workpiece when the workpiece is received in the workpiece holder. The first and second remote electrodes are spaced apart from the workpiece holder. The apparatus can also include an AC power supply, a DC power supply, and a switching assembly. The switching assembly is coupled to the workpiece electrode, the first remote electrode, the second remote electrode, the AC power supply, and the DC power supply. In operation, the switching assembly selectively couples the AC power supply and/or the DC power supply to any combination of the workpiece electrode, the first remote electrode, and/or the second remote electrode.

A different embodiment of the apparatus also includes a mechanical medium between the workpiece holder and the first and second remote electrodes. The mechanical medium, for example, can comprise a first pad carried by the first electrode and a second pad carried by the second electrode. In other embodiments, the mechanical medium comprises a pad carried by a rotating platen or a stationary table. The mechanical medium can be a non-abrasive pad or a fixed-abrasive pad used in chemical-mechanical planarizing processes.

In another embodiment, the apparatus further comprises a moveable remote electrode assembly spaced apart from the workpiece holder. The first and second remote electrodes are carried by the electrode assembly, and the mechanical medium comprises a first polishing pad carried by the first remote electrode and a second polishing pad carried by the second remote electrode. The moveable electrode assembly can move relative to the workpiece holder to (a) rub the first and second polishing pads across the face of the workpiece and (b) position the first and second remote electrodes relative to discrete regions on the surface of the workpiece.

The workpiece holder can comprise a substrate carrier having a chuck configured to hold the workpiece so that the processing side of the workpiece faces upward. In an alternate embodiment, the workpiece holder comprises a substrate carrier having a chuck configured to hold the workpiece so that the processing side faces downward. In either embodiment, the workpiece holder can include a drive assembly coupled to the substrate carrier to move the substrate carrier in addition to, or in lieu of, moving the first and second remote electrodes relative to the workpiece. Instill another embodiment, the workpiece electrode is carried by the workpiece holder so that the workpiece electrode contacts the seed layer or another type of layer on the processing side of the workpiece when the workpiece is received in the holder.

In another embodiment, the apparatus includes a controller coupled to the switching assembly. The controller comprises a computer having a computer-operate medium containing instructions to operate the switching assembly for controlling the application of a direct current, an alternating current, and/or a mechanical abrasive to the workpiece. More specifically, the controller causes the switching assembly to apply direct current, alternating current, and/or a mechanical medium to the workpiece either concurrently or at distinct stages throughout a processing cycle to plate, deplate, and/or mechanically remove material from the processing side of the workpiece. One embodiment of a method executed by the computer-operable medium comprises contacting a processing side of the workpiece with an electrolytic solution, and applying a direct electrical current to the workpiece electrode and at least the first remote electrode. In this embodiment, the workpiece electrode and the first remote electrode create an electrical field in the electrolytic solution. This embodiment of the method further includes applying an alternating current to the first remote electrode and the second remote electrode either while the direct current is applied to the workpiece electrode or after terminating the direct current. The method further includes contacting the processing side of the workpiece with the mechanical medium at least while applying the alternating current to the first and second remote electrodes.

The invention can also include several additional or different embodiments of methods for electrochemically and/or mechanically processing the workpiece. In one embodiment, the direct current is applied to the workpiece electrode and the first remote electrode during a discrete plating stage, and then only the alternating current is applied to the first and second remote electrodes while rubbing the mechanical medium against the processing side of the workpiece during a discrete deplating/planarizing stage. The direct current is accordingly terminated at the end of the plating stage and before the deplating/planarizing stage in this particular embodiment. An alternate embodiment includes rubbing the mechanical medium against the processing side of the workpiece while applying the direct current to the workpiece electrode and the first remote electrode. In still another alternate embodiment, the direct current is applied to the workpiece electrode and the first remote electrode while concurrently applying the alternating current to the first and second remote electrodes, and while concurrently rubbing the mechanical medium against the workpiece. Additionally, the dwell time of the first and second remote electrodes over discrete regions of the workpiece can be varied while applying the alternating current to remove more material from selected areas of the workpiece. The dwell time of the first and second remote electrodes, for example, can be increased over regions of the wafer that have a thicker overburden of the conductive material to more uniformly remove the overburden.

DETAILED DESCRIPTION

The present disclosure describes several methods and apparatuses for removing materials from microelectronic workpieces used in the fabrication of semiconductor devices, micro-mechanical devices, and other types of devices. Many specific details of certain embodiments of the invention are set forth in the following description and in FIGS. 3–7 to provide a thorough understanding of these embodiments. One skilled in the art, however, will understand that the present invention may have additional embodiments, or that the invention may be practiced without several of the specific details described below.

Figure 1:
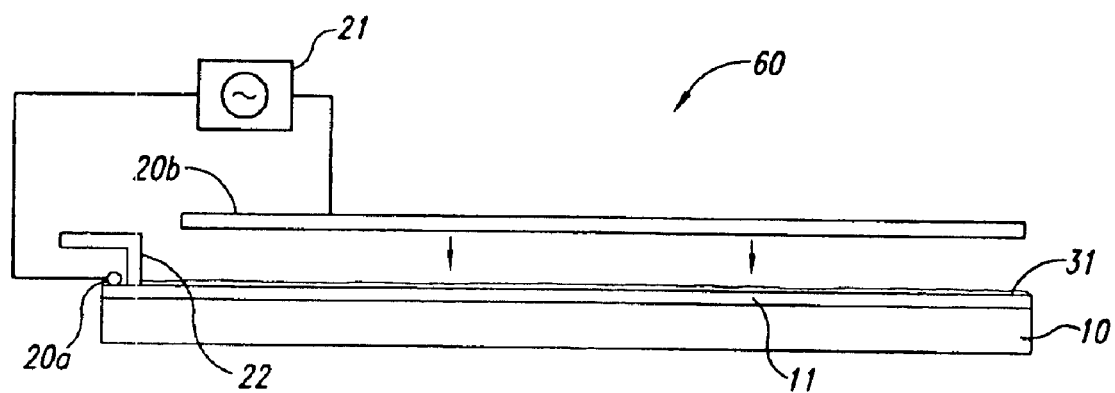
FIG. 1 is a side elevational view of an apparatus for removing conductive material from a microelectronic workpiece in accordance with the prior art.
Figure 2:
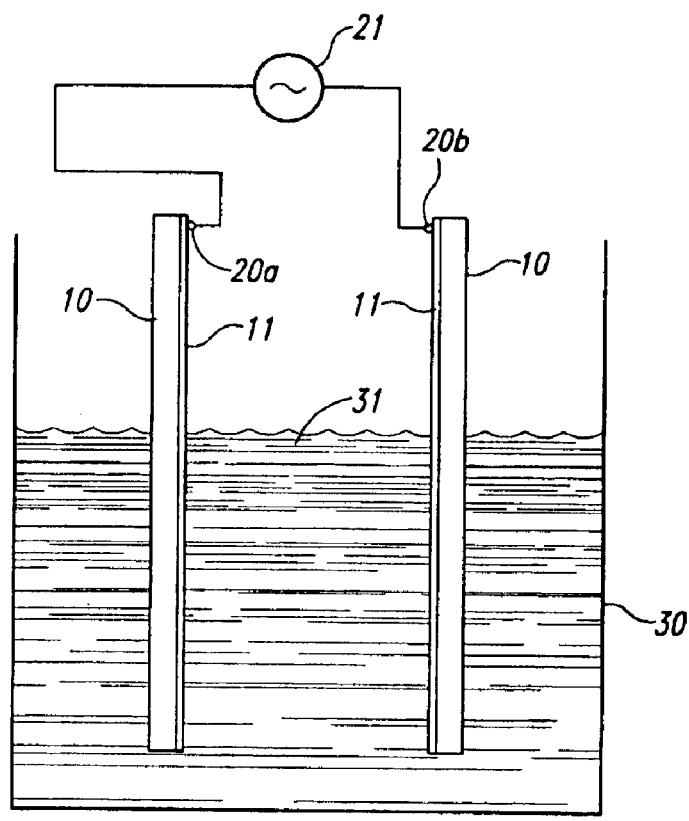
FIG. 2 is a side elevational view of another apparatus for removing conductive material from a plurality of microelectronic workpieces in accordance with the prior art.
Figure 3:
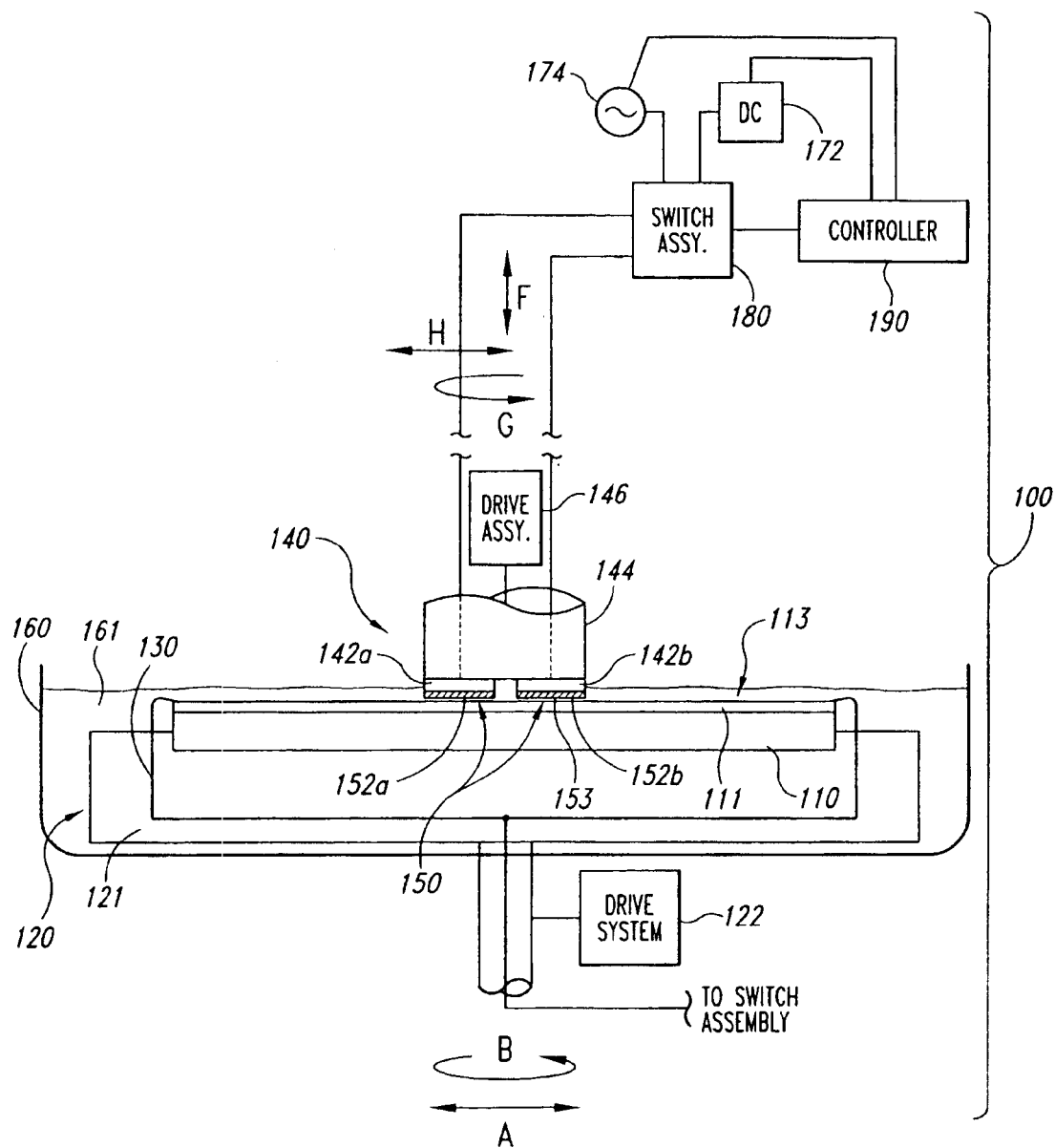
FIG. 3 is a side elevational view of an apparatus for electrochemical-mechanical processing of microelectronic workpieces in accordance with an embodiment of the invention. Selected components in FIG. 3 are shown schematically.

FIG. 3 illustrates an embodiment of an electrochemical-mechanical (ECM) apparatus 100 for processing a microelectronic workpiece 110 in accordance with an embodiment of the invention. The ECM apparatus 100 can be used to plate a layer 111 of material on a processing side 113 of the workpiece 110 and/or remove material from the layer 111. The ECM apparatus 100 can use various combinations of DC power, AC power, and mechanical abrasion to form conductive lines or other features on the workpiece 110.

The ECM apparatus 100 includes a workpiece holder 120 that is configured to receive the workpiece 110 and hold it in a desired position. The workpiece holder 120 can comprise a substrate carrier 121 having a chuck that holds the workpiece 110 so that the processing side 113 can face upward or downward. In the embodiment shown in FIG. 3, the workpiece holder 120 is a substrate carrier 121 having a chuck configured to hold the workpiece 110 so that the processing side 113 faces upward. The workpiece holder 120 can be stationary to hold the workpiece 110 in a fixed position, or it can be coupled to a drive system 122 to rotate or translate the workpiece 110 (shown by arrows A and B).

The ECM apparatus 100 also includes a workpiece electrode 130 that is configured to contact the processing side 113 of the workpiece 110 when the workpiece 110 is received in the workpiece holder 120. The workpiece electrode 130 can be carried by the workpiece holder 120. In an alternate embodiment, the workpiece electrode 130 can be carried by a support (not shown) separate from the workpiece holder 120. The workpiece electrode 130 can be a ring type contact or plurality of point contacts that contact the periphery of the workpiece 110. Many suitable workpiece electrodes for providing electrical current to the face layer 111 are known in the electrochemical plating arts. The workpiece electrode 130 is generally made from a metal that can be immersed in or coated by an electrochemical processing solution. In operation, the workpiece electrode 130 provides an anodic or cathodic charge to the face layer 111 on the workpiece 110 depending upon the particular process and application.

The ECM apparatus 100 can further include a remote electrode assembly 140 separate from the workpiece electrode 130. In one embodiment, the remote electrode assembly 140 has a plurality of remote electrodes 142 that are supported by an electrode carrier 144. The remote electrode assembly 140 can include a single remote electrode 142 or a plurality of discrete remote electrodes. In the embodiment shown in FIG. 3, the remote electrode assembly 140 includes a first remote electrode 142a and a second remote electrode 142b spaced apart from the first remote electrode 142a. The remote electrodes 142 are also spaced apart from the workpiece holder 120 so that the remote electrodes 142 do not contact the face layer 111 during a processing cycle.

The remote electrode assembly 140 can also include a drive assembly 146 that moves the electrodes 142 relative to the workpiece 110 for controlling the elevation (indicated by arrows "F"), rotation (indicated by arrow "G"), and/or translation of the electrodes (indicated by arrow "H"). In other embodiments, the remote electrode assembly 140 is stationary and does not necessarily include a drive assembly 146. When the remote electrode assembly 140 remains stationary, the drive system 122 associated with the workpiece holder 120 can provide relative motion between the workpiece 110 and the electrodes 142.

The ECM apparatus 100 also includes a mechanical medium 150 between the workpiece holder 120 and the remote electrodes 142 for mechanically abrading the workpiece 110. In the particular embodiment shown in FIG. 3, the mechanical medium 150 includes a first polishing pad 152a attached to an end of the first remote electrode 142a and a second polishing pad 152b attached to the end of the second remote electrode 142b. The mechanical medium 150 can be a non-abrasive element without abrasive particles or an abrasive element with fixed-abrasive particles. Additionally, the mechanical medium 150 can have a patterned surface with discrete raised features or grooves, or it can be substantially flat. The surfaces of the planarizing pads 152a–b can define a bearing surface 153 for contacting the face layer 111. Suitable types of mechanical media 150 that can be attached to the remote electrodes 142 are manufactured by 3M Corporation of St. Paul, Minn. and Rodel Corporation of Delaware.

The workpiece holder 120, the workpiece electrode 130, and the remote electrode assembly 140 can be positioned in a vessel 160 that contains an electrochemical processing solution 161. In alternate embodiments, the electrochemical processing solution 161 can be dispensed onto the workpiece 110 using a nozzle or other type of device similar to the dispensing devices used to depict planarizing solutions onto polishing pads in chemical-mechanical planarizing procedures. The vessel 160 is accordingly not necessary for such alternate embodiments. The electrochemical processing solution 161 can be a liquid or a gel with a composition that plates and/or deplates material from the face layer 111 on the workpiece 110. The electrochemical processing solution 161, for example, can be an electrolyte having metal ions and other constituents that are suitable for plating the metal ions onto a metal face layer 111. For example, the electrochemical processing solution 161 can have metal ions to plate platinum, tungsten, gold, copper or other metals onto the face layer 111.

The ECM apparatus 100 plates, deplates, and/or mechanically removes material from the face layer 111 on the workpiece 110. The workpiece electrode 130 and at least one of the remote electrodes 142 are in electrical communication with the electrochemical processing solution such that an electrical current flows through the face layer 111 when there is an electrical potential between the workpiece electrode 130 and either of the remote electrodes 142. A separate current can also flow through the face layer 111 when there is an electrical potential between the first remote electrode 142a and the second remote electrode 142b. The ECM apparatus 100 can accordingly include a DC power supply 172, an AC power supply 174, and a switching assembly 180. The switching assembly 180 is coupled to the workpiece electrode 130, the remote electrodes 142, the DC power supply 172, and the AC power supply 174. In operation, the switching assembly 180 selectively couples or decouples the DC power supply 172 and/or the AC power supply 174 with selected combinations of the electrodes 130 and 142 to plate and/or remove material from the workpiece 110.

The ECM apparatus 100 can further includes a controller 190 having a computer-operable medium that contains instructions to operate the switching assembly 180. The controller 190 can also be operatively coupled to the DC power supply 172 and the AC power supply 174 to adjust the electrical parameters of the current applied to the workpiece electrode 130 and the remote electrodes 142. The computer-operable medium can be software or hardware that (a) causes the switching assembly 180 to selectively couple the DC power supply 172 and the AC power supply 174 to selected combinations of the workpiece electrode 130 and/or the remote electrodes 142, and/or (b) causes the controller 190 to press the mechanical medium 150 against the surface of the face layer 111. For example, the computer-operable medium in the controller contains instructions to control the switch assembly 180, the DC power supply 172, AC power supply 174, the drive assembly 146, and the drive system 122 to plate material onto the face layer 111 and/or deplate/planarize the face layer 111.

An embodiment of a method effected by the instructions contained in the computer-operable medium includes a discrete plating stage and a discrete deplating/planarizing stage separate from the plating stage. The computer-operable medium in the controller 190 initiates the plating stage of this embodiment by contacting the processing side 113 of the workpiece 110 with the electrochemical processing solution 161 and applying a direct electrical current to the workpiece electrode 130 and at least one of the remote electrodes 142. The processing side 113 of the workpiece 110 can be brought into contact with the electrochemical processing solution 161 by filling the vessel 160 with the solution 161 or by dispensing the solution 161 directly onto the face layer 111. The direct electrical current can be applied to the workpiece electrode 110 by coupling the workpiece electrode 130 to one terminal of the DC power supply 172 and coupling one or both of the remote electrodes 142 to the other terminal of the DC power supply 172. The AC power supply 174 can be decoupled from the remote electrodes 142 and the workpiece electrode 130 so that only the direct current is applied to the workpiece 110 during the plating stage of this particular embodiment. In most embodiments for plating a metal onto the face layer 111, the workpiece electrode 130 is a cathode and the remote electrodes 142 are anodes. The polarity, however, can be switched for plating other types of materials such that the workpiece electrode 130 is an anode and the remote electrodes 142 are cathodes.

After a sufficient amount of material is plated onto the face layer 111, the computer-operable medium in the controller 190 initiates the deplating/planarizing stage by decoupling the DC power supply 172 from the workpiece electrode 130 and the remote electrodes 142. The controller 190 also causes (a) the switch assembly 180 to couple the AC power supply 174 to the first and second remote electrodes 142a and 142b, and/or (b) the drive assembly 146 to press the bearing surface 153 of the polishing pads 152a–b against the surface of the face layer 111. The controller 190 can also cause the drive assembly 146 and/or the drive system 122 to impart relative motion between the workpiece 110 and the electrode assembly 140 to rub the polishing pads 152a–b across the surface of the face layer 111.

In one embodiment of the deplating/planarizing stage, the alternating current is applied to the first and second remote electrodes 142a–b while the mechanical medium 150 rubs against this surface. The alternating current between the first and second remote electrodes 142a–b is expected to alter the surface of the face layer 111 so that it becomes easier to remove mechanically. The alternating current, for example, oxidizes the surface of platinum, copper, and other metals to form a surface stratum that is more susceptible to mechanical abrasion. The alternating current may also deplate material from certain types of face layers. As a result, material is removed from the surface of the face layer 111 during the deplating/planarizing stage because of the electrochemical interaction between the electrochemical processing solution 161 and the face layer 111 induced by the alternating current, and also because of the mechanical abrasion caused by the mechanical medium 150.

Another embodiment of a method effectuated by the instructions contained in the computer-operable medium of the controller 190 includes concurrently performing plating and deplating/planarizing by applying a direct electrical current to the workpiece electrode and to at least one of the first and second remote electrodes, and simultaneously applying an alternating current to the first and second remote electrodes. This embodiment can also include moving at least one of the microelectronic workpiece and/or the remote electrode assembly 140 relative to each other while applying the direct current and the alternating current to mechanically abrade material from the surface of the workpiece 110. In this embodiment, the alternating current can be significantly less than the direct current such that the direct current in effect carries the alternating current. The remote electrode assembly 140 and the workpiece 110 can remain stationary during this process, or at least the remote electrode assembly 140 or the workpiece 110 can move relative to the other to position the remote electrodes 142 relative to the surface of the face layer 111. For example, the remote electrodes 142 can have a higher dwell time over selected regions of the workpiece 110 as explained in more detail below.

The computer-operable medium of the controller 190 can also contain instructions to cause mechanical removal of material from the face layer 111 at various stages of a processing cycle. For example, the controller 190 can instruct the drive assembly 146 to press the bearing surfaces 153 of the polishing pads 152*a–b* against the face layer 111 either while (a) a direct current is applied to the workpiece electrode 130 and the remote electrodes 142 to plate material onto the workpiece 110, (b) an alternating current is applied to the first and second remote electrodes 142*a–b*, or (c) no electrical current is applied to any of the workpiece electrode 130, the first remote electrode 142*a*, or the second remote electrode 142*b*. As such, a chemical-mechanical planarizing process using only the chemistry in the electrochemical processing solution 161 and the mechanical medium 150 can be performed with or without electrical processing of the face layer 111.

In a further embodiment of the method, the dwell time of the remote electrode assembly 140 can be adjusted so that the remote electrodes 142 are juxtaposed to a first region of the processing side 113 for a different period of time than a second region. For example, when the thickness of the face layer 111 is greater at the perimeter of the workpiece 110 that at the center, the electrode assembly 140 can have a higher dwell time over the perimeter than the center during the deplating/planarizing stage to the remove more material from the workpiece. The dwell time of the electrode assembly 140 during the deplating/planarizing stage is typically higher over areas of the workpiece where the face layer 111 is thicker. It will be appreciated that the dwell time of the remote electrode assembly 140 can be uniform across the face of the workpiece 110, or it can vary according to other parameters in other embodiments of the invention.

Several embodiments of the ECM apparatus 100 are expected to provide highly planar surfaces on the workpiece 110. By applying an alternating current to the remote electrodes 142 and rubbing the mechanical medium 150 against the face layer 111, the primary factors driving the removal of material from the face layer 111 are (a) the oxidation of the material at the surface of the face layer 111, and (b) the mechanical removal of the oxidized material. Moreover, because the electrical current is applied to the face layer 111 via remote electrodes 142 that do not contact the face layer 111, the remote electrodes 142 can be moved relative to the workpiece 110 (or the workpiece 110 can be moved relative to the electrodes 142) to avoid producing a consistent voltage drop across the face layer 111 as the overburden of the face layer becomes very thin toward the end of the deplating/planarizing cycle. This is expected to provide a highly planar surface on the face layer 111.

Figure 4A:
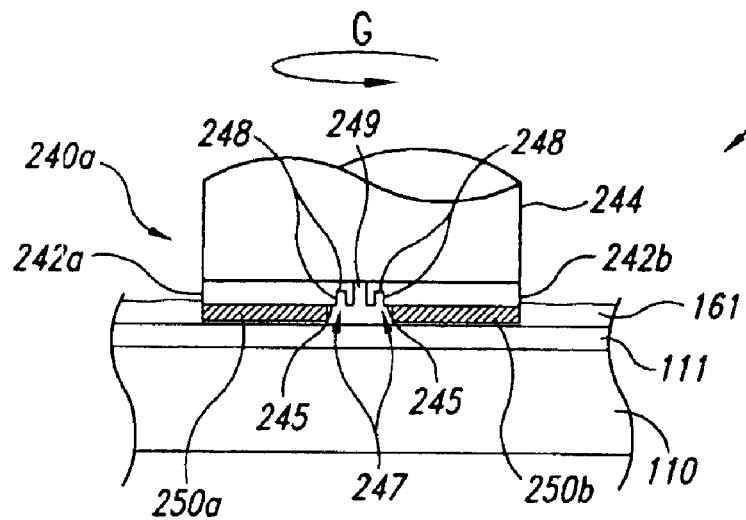
FIGS. 4A–4C are side cross-sectional views of remote electrode assemblies for use with electrochemical-mechanical apparatuses in accordance with several embodiments of the invention. Several components of the remote electrode assembly are shown schematically in these figures.
Figure 4B:
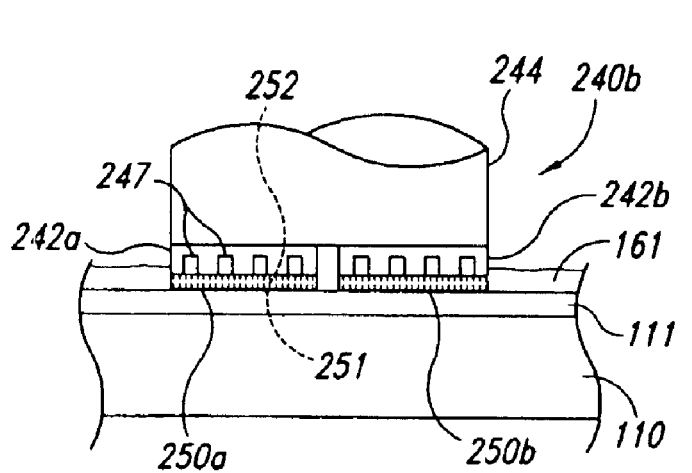
Figure 4C:
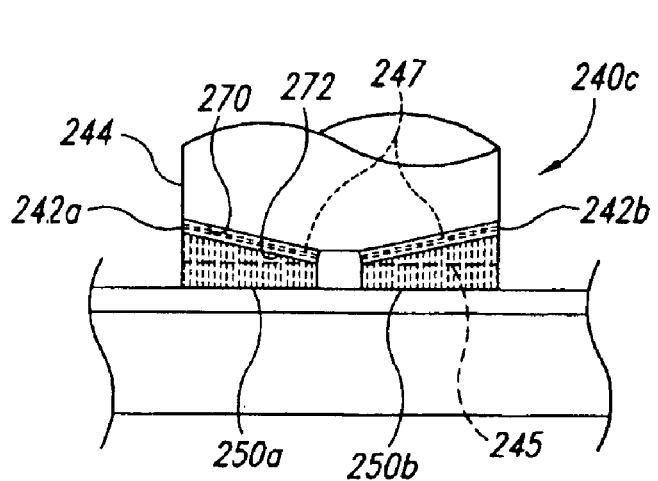

FIGS. 4A–4C illustrate several different remote electrode assemblies that receive gases generated during the electrochemical-mechanical processes and conduct the gases away from the microelectronic workpiece 110 and/or the remote electrodes. Referring to FIG. 4A, one embodiment of an ECM apparatus 200 includes a remote electrode assembly 240*a* having first and second remote electrodes 242*a* and 242*b* carried by an electrode carrier 244. The remote electrode assembly 240 can further include a mechanical medium 250 (identified as a first mechanical medium 250*a* adjacent to the first remote electrode 242*a* and a second mechanical medium 250*b* adjacent the second remote electrode 242*b*). In one aspect of this embodiment, the mechanical medium 250 can be a generally non-porous material that covers less than the entire downwardly facing surface of each of the remote electrodes 242*a–b*. An exposed surface 245 of each of the remote electrodes 242*a–b* accordingly faces the workpiece 110 directly. These exposed surfaces 245 can include channels 247 defined by channel surfaces 248 to collect and conduct gases away from the region proximate to the workpiece 110 and/or the remote electrodes 242*a–b*.

In a further aspect of this embodiment, the remote electrodes 242*a–b* can be separated from each other by a gap 249 that can reduce or eliminate direct electrical coupling between the remote electrodes 242*a–b*. As a result, the electrical current flows from one of the remote electrodes 242*a* or 242*b* through the conductive material 111 of the microelectronic substrate 110 and then to the other of the remote electrodes 242*a* or 242*b*. Furthermore, the gap 249 can operate in addition to, or in lieu of, the channels 247 to conduct the gases away from the electrodes 242*a–b* and/or the microelectronic workpiece 110. In still a further aspect of this embodiment, the electrode carrier 244 can rotate (indicated by arrows "G") at a rate sufficient to force the gases radially outwardly by centrifugal force.

Another feature of the ECM apparatus 200 shown in FIG. 4A is that the type and placement of the mechanical media 250*a–b* can control the electrical coupling between the remote electrodes 242*a–b* and the microelectronic workpiece 110. For example, the mechanical media 250*a–b* can be generally non-porous pads such that only the exposed portion of the electrodes 242*a–b* are electrically coupled to the workpiece 110 via the electrochemical processing solution 161. In an alternate embodiment, the mechanical media 250*a–b* can be porous or partially porous pads to allow some electrical coupling between the remote electrodes 242*a–b* and the workpiece 110 in regions where the mechanical media 250*a–b* are interposed between the workpiece 110 and the electrodes 242*a–b*. The degree of electrical coupling through the mechanical media 250*a–b* can be less than the degree of the electrical coupling between the exposed portions of the electrodes 242*a–b* and the workpiece 110.

FIG. 4B illustrates another embodiment of the ECM apparatus 200 that includes a remote electrode assembly 240*b* having first and second remote electrodes 242*a–b*, and an electrode carrier 244 carrying the first and second remote electrodes 242*a–b*. The ECM apparatus 200 in this embodiment can also include first and second mechanical media 250*a–b* carried by respective first and second remote electrodes 242*a–b*. Each of the mechanical media 250*a–b* is a porous pad that includes pores 251 and passages 252 extending from the pores 251 upwardly to the remote electrodes 242*a–b*. The remote electrodes 242*a–b* can include downwardly facing channels 247 in fluid communication with the passages 252. Accordingly, the passages 252 can allow gases to rise from the workpiece 110 and through the mechanical medium 250 where they are collected in the channels 247. Additionally, when the passages 252 are filled with the solution 161, the passages 252 can provide an electrical link between the electrodes 242a–b and the workpiece 110.

FIG. 4C illustrates another embodiment of the ECM apparatus 200 having a remote electrode assembly 240c including first and second remote electrodes 242a–b and corresponding first and second mechanical media 250a–b. In one aspect of this embodiment, the mechanical media 250a–b can be porous to conduct gas bubbles away from the workpiece 110. Another aspect of this embodiment can include downwardly facing channels 247 in the electrodes 242a–b to collect and conduct the gas bubbles away from the electrodes 242a–b. The remote electrode assembly 240c can also include an electrode carrier 244 having canted lower surfaces 270 that orient the passages 247 at a selected angle of inclination. In one aspect of this embodiment, a downwardly facing surface 272 of each of the electrodes 242a–b is also inclined. The angle of inclination can be shallow to reduce the difference in distance between the workpiece 110 and the electrodes 242a–b from the center of the electrode assembly 240c to the outer periphery. In alternate embodiments, the inclination angle can be steep to deliberately reduce the electrical coupling between the perimeter of the electrodes 242a–b and the workpiece 110. In a further embodiment, the channels 247 can be inclined upwardly (shown in FIG. 4C), although a lower surface of the electrodes 242a–b can be horizontal (indicated in dashed lines in FIG. 4C by reference number 245).

Figure 5A:
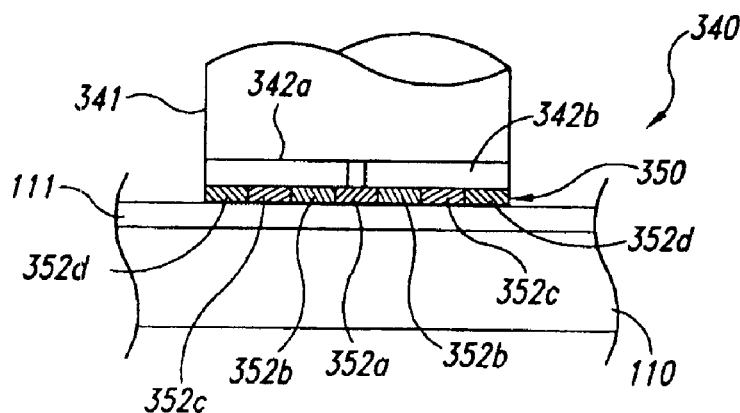
FIGS. 5A–5E are side cross-sectional views of remote electrode assemblies for use with electrochemical-mechanical apparatuses in accordance with several embodiments of the invention. Several components of the remote electrode assembly are shown schematically in these figures.

FIGS. 5A–5E illustrate several remote electrode assemblies 240 for use with ECM apparatuses in accordance with additional embodiments of the invention. Referring to FIG. 5A, this figure illustrates an embodiment of a remote electrode assembly 340 comprising an electrode carrier 341, first and second remote electrodes 342a–b carried by the electrode carrier 341, and a mechanical medium 350 carried by the first and second remote electrodes 342a–b. The mechanical medium 350 can include a plurality of regions 352a–d that have different electrical characteristics. For example, the regions 352b–d can be disposed annularly around a central region 352a in one embodiment, or in other embodiments the regions can have other patterns or arrangements (e.g., a grid). The regions 352a–d can have different dielectric constants and/or conductivities to vary the degree of electrical coupling between the remote electrodes 342a–b and the workpiece 110 spatially across the face layer 111. Accordingly, the impedance of the circuit(s) formed by the remote electrodes 342a–b and the face layer 111 can vary over the surface of workpiece 110 to provide a variation in the rate at which material is electrically removed or otherwise altered. Alternatively, the spatially varied electrical characteristics can corrected for factors that would otherwise result in spatially non-uniform material removal rates (e.g., a consistent difference in the relative velocity between the workpiece 110 and the mechanical medium 350).

Figure 5B:
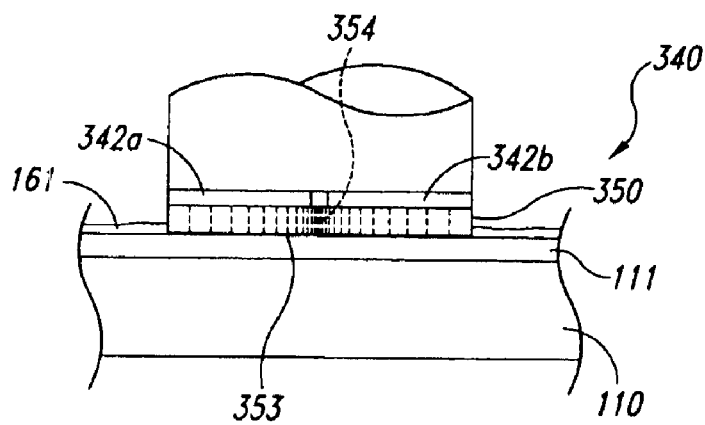

FIG. 5B illustrates a remote electrode assembly 340 having a porous mechanical medium 350 in accordance with another embodiment of the invention. In one aspect of this embodiment, the mechanical medium 350 can include pores 353 and passages 354 in which the processing solution 161 can be contained to electrically couple the remote electrodes 342a–b to the face layer 111 of the workpiece 110. In a further aspect of this embodiment, the porosity of the mechanical medium 350 can vary in a continuous manner from one region to another. For example, the porosity can decrease in a radially outward direction to reduce the electrical coupling at the perimeter of the workpiece 110. In other embodiments, the porosity can change in other manners to provide a different level of electrically coupling over different portions of the workpiece 110.

Figure 5C:
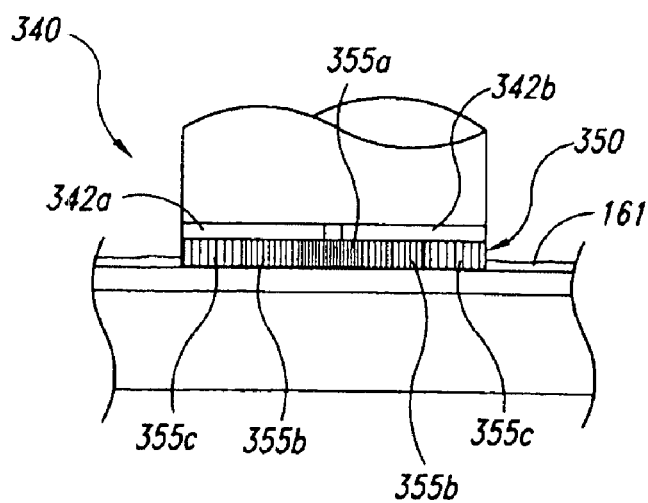

FIG. 5C illustrates a remote electrode assembly 340 that includes a mechanical medium 350 having three concentric regions 355a–c that each have a different porosity. For example, a first region 355a can have a first uniform porosity throughout the first region 355a, a second region 355b can have a second porosity that is uniform throughout the second region 355b, and a third region 355c can have a third porosity that is uniform throughout the third region 355c. In one aspect of this embodiment, the porosity of the mechanical medium 350 can decrease in a radial outward direction, or in other embodiments the porosity can change in other manners. In still further embodiments, the mechanical medium 350 can have more or fewer than the three distinct regions 355a–c.

Figure 5D:
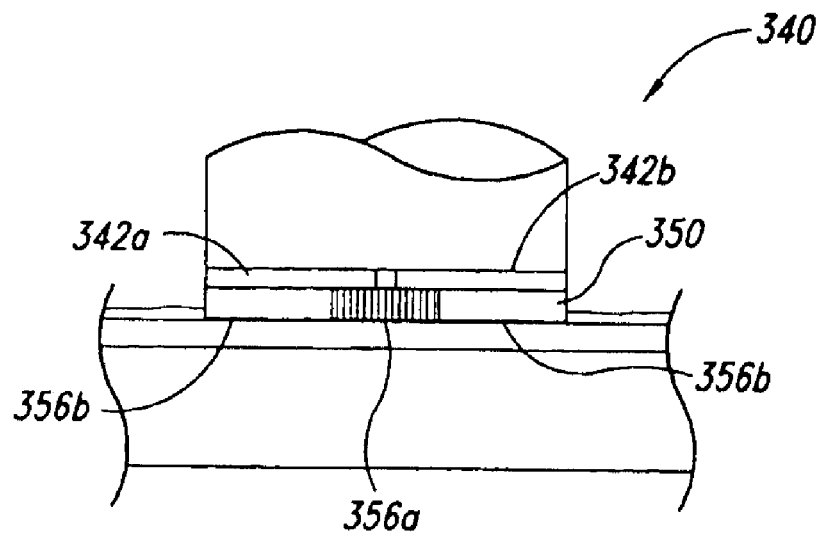
Figure 5E:
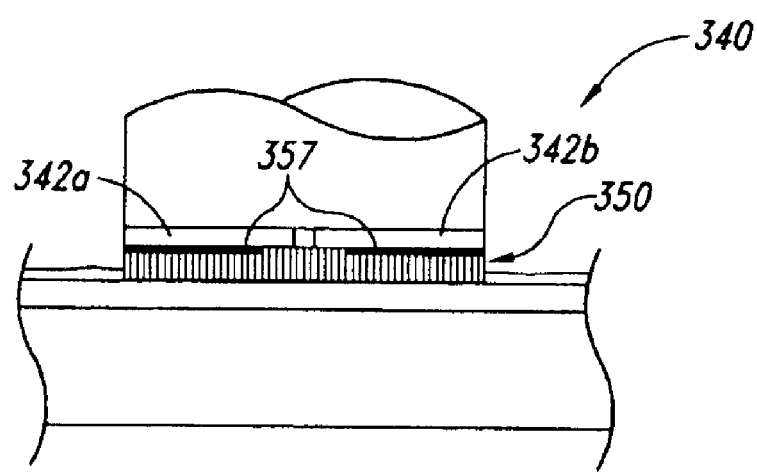

FIG. 5D illustrates a remote electrode assembly 340 having a mechanical medium 350 with porous and non-porous regions in accordance with another embodiment of the invention. For example, the mechanical medium 350 can include a central porous region 356a and a outer non-porous region 356b. The outer non-porous region 356b can be positioned concentrically about the central porous region 356a. Accordingly, the remote electrodes 342a–b can be electrically coupled with the workpiece 110 only in the central region of the remote electrode assembly 340, and the mechanical medium 350 can mechanically remove material over a larger contact area. FIG. 5E illustrates an alternate arrangement in which the remote electrode assembly 340 includes a mechanical medium 350 having uniform porosity. The mechanical medium 350 can be attached to a mask 357 that prevents or at least limits electrical coupling between the remote electrodes 342a–b and the workpiece 110 in regions where the mask 357 is interposed between the workpiece 110 and the electrodes 342a–b.

Figure 6:
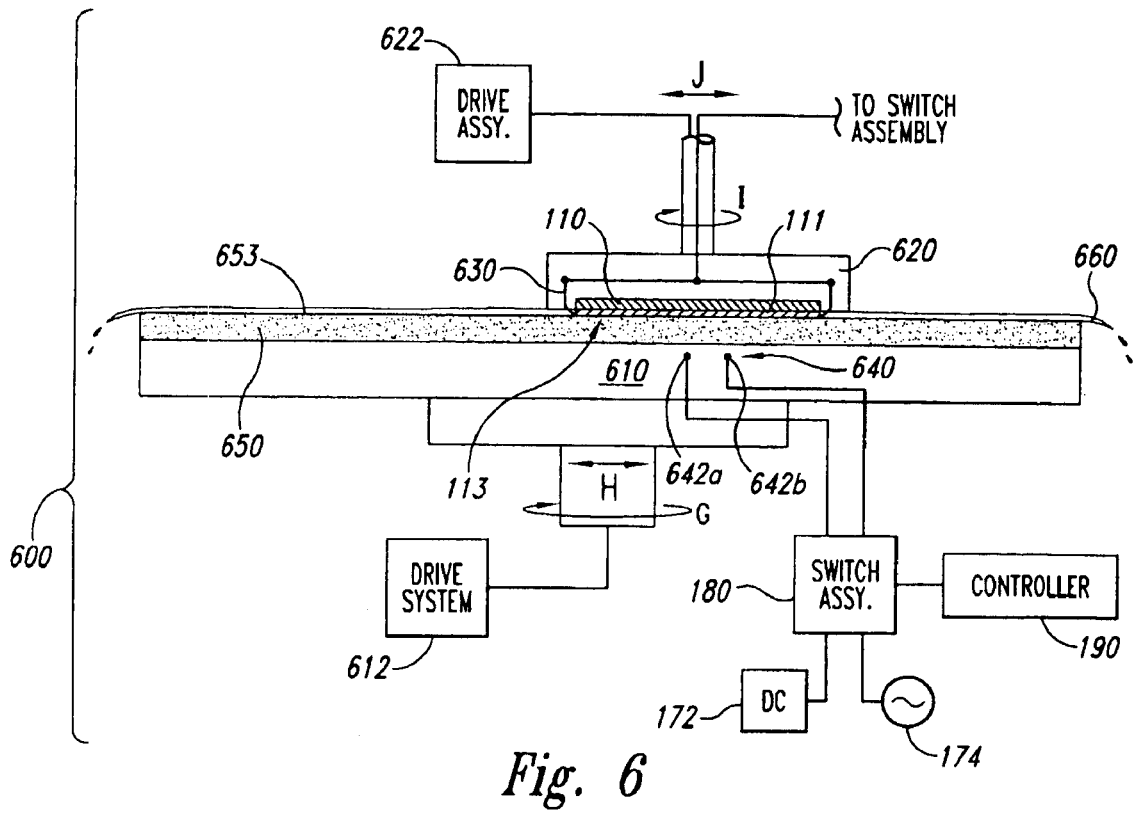
FIG. 6 is a side cross-sectional view of an apparatus for electrochemically-mechanically processing microelectronic workpieces in accordance with another embodiment of the invention. Selected components are also shown schematically in FIG. 6.

FIG. 6 is a cross-sectional side elevational view of an ECM processing apparatus 600 for electrochemical-mechanical processing the microelectronic workpiece 110 in accordance with another embodiment of the invention. Several components of the ECM processing apparatus 600 are shown schematically in FIG. 6, and components with like reference numbers refer to like components in FIGS. 2–6. In one aspect of this embodiment, the ECM processing apparatus 600 has a platen or table 610, a workpiece carrier assembly 620, a workpiece electrode 630 carried by the workpiece carrier assembly 620, and a remote electrode assembly 640 having remote electrodes 642a–b carried by the table 610. The ECM processing apparatus 600 can also include a mechanical medium 650 carried by the table 610. A drive system 612 rotates (arrow G) and/or reciprocates (arrow H) the table 610, and a drive assembly 622 can rotate (arrow I) or translate (arrow J) the workpiece carrier 620. The movement of the table 610 and the workpiece carrier 620 can be coordinated to press the processing side 113 of the workpiece 110 against a bearing surface 653 of the mechanical medium 650.

During a processing cycle, one or more processing solutions 650 can be deposited onto the bearing surface 653 of the mechanical medium 650. The mechanical medium 650 and the processing solution 660 are selected to provide the appropriate electrical, chemical and mechanical characteristics for processing the workpiece 110. For example, the mechanical medium 650 can be a fixed-abrasive polishing pad or a non-abrasive pad. The processing solution 660 can be an electrolytic solution for plating or deplating material from the workpiece 110, and/or a planarizing solution for chemically and/or mechanically removing material from the workpiece 110. The processing solution 660 can accordingly include an electrolyte and/or abrasive particles, as well as chemicals that are selected to perform particular reactions with the workpiece 110.

The ECM processing apparatus 600 can also include the switch assembly 180, the DC power supply 172, the AC power supply 174, and the controller 190. The workpiece electrode 630 and the remote electrodes 642a–b are coupled to the switch assembly 180 for selectively applying a direct current and/or an alternating current to the various electrodes. The electrochemical processing apparatus 600 shown in FIG. 6 can accordingly perform many of the same methods described above with reference to FIG. 3.

Figure 7:
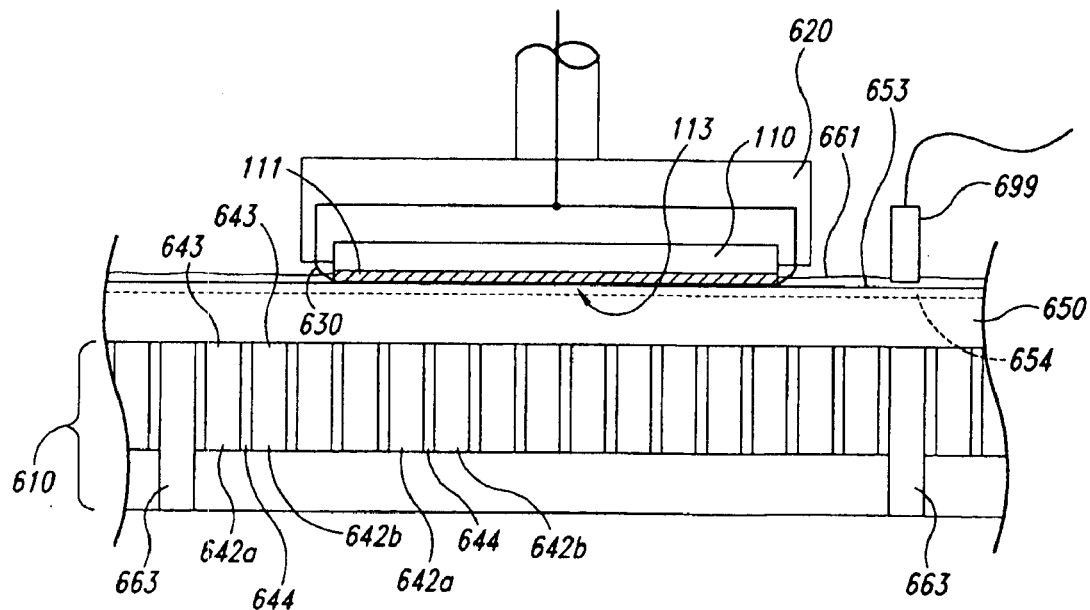
FIG. 7 is a side cross-sectional view of a workpiece holder and a remote electrode assembly for use with electrochemical-mechanical apparatuses in accordance with certain embodiments of the invention.

FIG. 7 is a side elevational view of an embodiment of the ECM processing apparatus 600 explained above showing a portion of the apparatus in greater detail. In one aspect of this embodiment, the ECM apparatus 600 can further include a plurality of first and second remote electrodes 642a–b beneath, and/or integrated with, the mechanical medium 650. For example, the remote electrodes 642a–b can be arranged in pairs and carried by the table 610. Each of the remote electrodes 642a–b can have a surface 643 facing toward the microelectronic workpiece 110, and each of the remote electrodes 642a–b can be adjacent to a divider 644 that electrically isolates the first and second electrodes 642a–b from one another. The first and second electrodes 642a–b can also be divided into discrete groups by a plurality of fluid conduits 663 through which the processing solution 661 can flow to the bottom surface of the mechanical medium 650. The mechanical medium 650 can accordingly have pores or passages (not shown in FIG. 7) through which the processing solution 661 can flow to the bearing surface 653. The mechanical medium 650 can also include a plurality of channels 654 at the bearing surface 653 that (a) transport the processing solution 661 across the surface of the mechanical medium 650, and (b) collect and move gas bubbles away from the workpiece 110.

Referring still to FIG. 7, the ECM processing apparatus 600 can optionally include a non-contact energy source 699 that is proximate to the processing solution 661 during a processing cycle. The non-contact energy source 699 can be an ultrasonic energy emitter that transmits ultrasonic energy into the processing fluid 661. It is expected that imparting ultrasonic energy to the processing solution 661 will increase the rate and/or the efficiency at which gas bubbles are removed from the region proximate to workpiece 110.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. An apparatus for electrochemical-mechanical processing of microelectronic workpieces, comprising:
   a workpiece holder configured to receive a microelectronic workpiece;
   a workpiece electrode configured to contact a processing side of the workpiece when the workpiece is received in the workpiece holder;
   a first remote electrode and a second remote electrode, the first and second remote electrodes being spaced apart from the workpiece holder;
   a mechanical medium having a bearing surface facing the workpiece holder and a backside facing the first and second remote electrodes;
   a switching assembly coupled to the workpiece electrode, the first remote electrode, and the second remote electrode;
   an AC power supply electrically coupled to the switching assembly to be in electrical communication with the first and second remote electrodes via the switching assembly forming a closed circuit; and
   a DC power supply electrically coupled to the switching assembly to be in electrical communication with the workpiece electrode at one polarity and at least one of the first and second remote electrodes at an opposite polarity via the switching assembly.

2. The apparatus of claim 1 wherein the workpiece electrode is carried by the workpiece holder.

3. The apparatus of claim 1 wherein:
   the workpiece electrode is carried by the workpiece holder; and
   the first remote electrode and the second remote electrode are carried by a remote electrode assembly separate from the workpiece holder.

4. The apparatus of claim 1 wherein:
   the workpiece holder comprises a substrate carrier having a chuck configured to hold the workpiece so that the processing side faces downward and a drive assembly coupled to the substrate carrier to move the substrate carrier; and
   the workpiece electrode is carried by the workpiece holder.

5. The apparatus of claim 1 wherein:
   the workpiece holder comprises a substrate carrier having a chuck configured to hold the workpiece so that the processing side faces upward and a drive assembly coupled to the substrate carrier to move the substrate carrier; and
   the workpiece electrode is carried by the workpiece holder.

6. The apparatus of claim 1, further comprising an electrode assembly spaced apart from the workpiece holder, and wherein the first remote electrode and the second remote electrode are carried by the electrode assembly.

7. The apparatus of claim 1 wherein:
   the apparatus further comprises a movable electrode assembly spaced apart from the workpiece holder, the electrode assembly being moveable relative to the workpiece holder; and
   the first remote electrode and the second remote electrode are carried by the electrode assembly.

8. The apparatus of claim 1 wherein:
   the apparatus further comprises a moveable electrode assembly spaced apart from the workpiece holder, the electrode assembly being moveable relative to the workpiece holder;
   the first remote electrode and the second remote electrode are carried by the electrode assembly; and
   the mechanical medium comprises a first polishing pad carried by the first remote electrode and a second polishing pad carried by the second remote electrode.

9. The apparatus of claim 1 wherein:
   the apparatus further comprises a table;
   the mechanical medium comprises a polishing pad carried by the table;

the workpiece holder is positioned over the polishing pad, and the workpiece electrode is carried by the workpiece holder; and the first remote electrode and the second remote electrode are carried by the table.

10. The apparatus of claim 1, further comprising a controller having a computer operable medium containing instructions to operate the apparatus according to a process comprising (a) contacting the processing side of the microelectronic workpiece with an electrochemical processing solution, (b) applying a direct electrical current to the workpiece electrode and at least one of the first remote electrode and/or the second remote electrode while the workpiece contacts the electrochemical processing solution, (c) applying an alternating electrical current to at least one of the first remote electrode and/or the second remote electrode while the workpiece contacts the electrochemical processing solution, and (d) pressing the processing side of the workpiece against the mechanical medium at least while applying the alternating current.

11. The apparatus of claim 1, further comprising a controller having a computer operable medium containing instructions to operate the apparatus according to a process comprising (a) contacting the processing side of the microelectronic workpiece with an electrochemical processing solution, (b) applying a direct electrical current to the workpiece electrode and at least one of the first remote electrode and/or the second remote electrode while the workpiece contacts the electrochemical processing solution, (c) applying an alternating electrical current to the first remote electrode and the second remote electrode while the workpiece contacts the electrochemical processing solution, and (d) pressing the processing side of the workpiece against the mechanism medium at least while applying the alternating current.

12. The apparatus of claim 1, further comprising a controller having a computer operable medium containing instructions to operate the apparatus according to a process comprising (a) contacting the processing side of the microelectronic workpiece with an electrochemical processing solution, (b) applying a direct electrical current to the workpiece electrode and at least one of the first remote electrode and/or the second remote electrode while the workpiece contacts the electrochemical processing solution, (c) applying an alternating electrical current to the first remote electrode and the second remote electrode while applying the direct electrical current.

13. The apparatus of claim 1, further comprising a controller having a computer operable medium containing instructions to operate the apparatus according to a process comprising (a) contacting the processing side of the microelectronic workpiece with an electrochemical processing solution, (b) applying a direct electrical current to the workpiece electrode and at least one of the first remote electrode and/or the second remote electrode while the workpiece contacts the electrochemical processing solution, (c) applying an alternating electrical current to the first remote electrode and the second remote electrode while the workpiece contacts the electrochemical processing solution, (d) pressing the processing side of the workpiece against the mechanical medium at least while applying the alternating current, and (e) moving the at least one of the workpiece and/or the first and second remote electrodes so that the first and the second remote electrodes have a higher dwell time at a first region of the workpiece than at a second region.

14. An apparatus for electrochemical-mechanical processing of microelectronic workpieces, comprising:
a workpiece holder configured to receive a microelectronic workpiece;
a workpiece electrode configured to contact a processing side of the workpiece when the workpiece is received in the workpiece holder;
a first remote electrode and a second remote electrode, wherein the first and second remote electrodes are juxtaposed to the workpiece holder to be spaced apart from the processing side of the workpiece when the workpiece is received in the workpiece holder;
an AC power supply;
a DC power supply; and
a switching assembly coupled to the workpiece electrode, the first remote electrode, the second remote electrode, the AC power supply, and the DC power supply, wherein the switching assembly includes at least a first configuration and a second configuration, and wherein in the first configuration, the DC power supply is coupled to the workpiece electrode and the first remote electrode while the AC power supply is simultaneously coupled to the first and second remote electrodes, and wherein in the second configuration, the DC power supply is connected to the workpiece electrode and both the first and second remote electrodes while simultaneously the AC power supply is coupled to the first and second remote electrodes.

15. The apparatus of claim 14 wherein the workpiece electrode is carried by the workpiece holder, and wherein the apparatus further comprises a mechanical medium having a bearing surface facing the workpiece holder and a backside facing the first and second remote electrodes.

16. The apparatus of claim 15 wherein:
the workpiece electrode is carried by the workpiece holder; and
the first remote electrode and the second remote electrode are carried by an electrode assembly separate from the workpiece holder.

17. The apparatus of claim 15, further comprising an electrode assembly spaced apart from the workpiece holder, and wherein the first and second remote electrodes are carried by the electrode assembly.

18. The apparatus of claim 15 wherein:
the apparatus further comprises a moveable electrode assembly spaced apart from the workpiece holder, wherein the electrode assembly is moveable relative to the workpiece holder; and
the first and second remote electrodes are carried by the electrode assembly.

19. The apparatus of claim 15 wherein:
the apparatus further comprises a moveable electrode assembly spaced apart from the workpiece holder;
the first and second remote electrodes are carried by the electrode assembly; and
the mechanical medium comprises a first polishing pad carried by the first remote electrode and a second polishing pad carried by the second remote electrode.

20. The apparatus of claim 15 wherein:
the apparatus further comprises a table;
the mechanical medium comprises a polishing pad carried by the table;
the workpiece holder is positioned over the polishing pad, and the workpiece electrode is carried by the workpiece holder; and the first and second remote electrodes are carried by the table.

21. An apparatus for electrochemical-mechanical processing of microelectronic workpieces, comprising:
a workpiece holder configured to receive a microelectronic workpiece;
a first electrode configured to contact a processing side of the workpiece when the workpiece is received in the workpiece holder;
a second electrode and a third electrode, the second and third electrodes being remote electrodes that are spaced apart from the workpiece holder;
a mechanical medium between the workpiece holder and each of the second and third electrodes;
an AC power supply;
a DC power supply; and
a switching assembly coupled to the first electrode, second electrode, third electrode, AC power supply, and the DC power supply, wherein the switching assembly includes at least three configurations comprising:
a first configuration, wherein the DC power supply is disconnected from the workpiece electrode and the first and second remote electrodes while the AC power supply is coupled to the first and second remote electrodes;
a second configuration, wherein the DC power supply is coupled to the workpiece electrode and both the first and second remote electrodes while the AC power supply is disconnected from the first and second remote electrodes;
a third configuration, wherein the DC power supply is coupled to the workpiece electrode and both the first and second remote electrodes while simultaneously the AC power supply is coupled to the first and second remote electrodes.

22. The apparatus of claim 21 wherein the first electrode is carried by the workpiece holder.

23. The apparatus of claim 21 wherein:
the first electrode is carried by the workpiece holder; and
the second and the third electrodes are carried by an electrode assembly separate from the workpiece holder.

24. The apparatus of claim 21 wherein:
the workpiece holder comprising a substrate carrier having a chuck configured to hold the workpiece so that the processing side faces downward and a drive assembly coupled to the substrate carrier to move the substrate carrier; and
the first electrode is carried by the workpiece holder.

25. The apparatus of claim 21 wherein:
the workpiece holder comprises a substrate carrier having a chuck configured to holder the workpiece so that the processing side faces upward and a drive assembly coupled to the substrate carrier to move the substrate carrier; and
the first electrode is carried by the workpiece holder.

26. The apparatus of claim 21, further comprising an electrode assembly spaced apart from the workpiece holder, and wherein the second and the third electrodes are carried by the electrode assembly.

27. The apparatus of claim 21 wherein:
the apparatus further comprises a moveable electrode assembly spaced apart from the workpiece holder; and
the second and the third electrodes are carried by the electrode assembly.

28. The apparatus of claim 21 wherein:
the apparatus further comprises a moveable electrode assembly spaced apart from the workpiece holder;
the second and the third electrodes are carried by the electrode assembly; and
the mechanical medium comprises a first polishing pad carried by the second electrode and a second polishing pad carried by the third electrode.

29. The apparatus of claim 21 wherein:
the apparatus further comprises a table;
the mechanical medium comprises a polishing pad carried by the table;
the workpiece holder is positioned over the polishing pad, and the first electrode is carried by the workpiece holder; and
the second and the third electrodes are carried by the table.

30. The apparatus of claim 21, further comprising a controller having a computer operable medium containing instructions to operate the apparatus according to a process comprising (a) contacting the processing side of the microelectronic workpiece with an electrolytic solution, (b) applying a direct electrical current to the first electrode and at least one of the second and/or the third electrodes while the workpiece contacts the electrolytic solution, (c) applying an alternating electrical current to at least one of the second and/or the third electrodes while the workpiece contacts the electrolytic solution, and (d) pressing the processing side of the workpiece against the mechanical medium at least while applying the alternating current.

31. The apparatus of claim 21, further comprising a controller having a computer operable medium containing instructions to operate the apparatus according to a process comprising (a) contacting the processing side of the microelectronic workpiece with an electrolytic solution, (b) applying a direct electrical current to the first electrode and at least one of the second and/or the third electrodes while the workpiece contacts the electrolyte solution, (c) applying an alternating electrical current to the second and the third electrodes while the workpiece contacts the electrolytic solution, and (d) pressing the processing side of the workpiece against the mechanical medium at least while applying the alternating current.

32. The apparatus of claim 21, further comprising a controller having a computer operable medium containing instructions to operate the apparatus according to a process comprising (a) contacting the processing side of the microelectronic workpiece with an electrolytic solution, (d) applying a direct electrical current to the first electrode and at least one of the second and/or the third electrodes while the workpiece contacts the electrolytic solution, (c) applying an alternating electrical current to the second and the third electrodes while applying the direct electrical current.

33. The apparatus of claim 21, further comprising a controller having a computer operable medium containing instructions to operate the apparatus according to a process comprising (a) contacting the processing side of the microelectronic workpiece with an electrolytic solution, (b) applying a direct electrical current to the first electrode and at least one of the second and/or the third electrodes while the workpiece contacts the electrolytic solution, (c) applying an alternating electrical current to the second and the third electrodes while the workpiece contacts the electrolytic solution, (d) pressing the processing side of the workpiece against the mechanical medium at least while applying the alternating current, and (e) moving the at least one of the workpiece and/or the second and third electrodes so that the second and the third electrodes have a higher dwell time at a first region of the workpiece than at a second region.

34. An apparatus for electrochemical-mechanical processing of microelectronic workpieces, comprising:
   a workpiece holder configured to receive a microelectronic workpiece;
   a workpiece electrode configured to contact a processing side of the workpiece when the workpiece is received in the workpiece holder;
   a first remote electrode and a second remote electrode, the first and second remote electrodes being spaced apart from the workpiece holder;
   a mechanical medium between the workpiece holder and each of the first and second remote electrodes;
   an AC power supply;
   a DC power supply; and
   a switching assembly coupled to the workpiece electrode, first remote electrode, second remote electrode, AC power supply, and the DC power supply; and
   a controller coupled to the switching assembly, the controller including a computer operable medium containing instructions to operate the switching assembly according to a process including (a) coupling the workpiece electrode and at least one of the first and second remote electrodes to the DC power supply via the switching assembly, and (b) coupling the first and second remote electrodes to the AC power supply via the switching assembly.

35. An apparatus for electrochemical-mechanical processing of microelectronic workpieces, comprising:
   a workpiece holder configured to receive a microelectronic workpiece;
   a workpiece electrode configured to contact a processing side of the workpiece when the workpiece is received in the workpiece holder;
   a first remote electrode and a second remote electrode, the first and second remote electrodes being spaced apart from the workpiece holder;
   a mechanical medium between the workpiece holder and each of the first and second remote electrodes;
   a switching assembly coupled to the workpiece electrode, first remote electrode, and second remote electrode;
   an AC power supply electrically coupled to the switching assembly to be in electrical communication with the first and second remote electrodes forming a closed circuit; and
   a DC power supply electrically coupled to the switching assembly to be in electrical communication with the workpiece electrode at one polarity and at least one of the first and second remote electrodes at an opposite polarity via the switching assembly.

36. An apparatus for electrochemical-mechanical processing of microelectronic workpieces, comprising:
   a workpiece holder configured to receive a microelectronic workpiece;
   a workpiece electrode carried by the workpiece holder, the workpiece electrode being configured to contact a processing side of the workpiece when the workpiece is received in the workpiece holder;
   a material removal device including an electrode assembly facing the workpiece holder, a first remote electrode carried by the electrode assembly, a second remote electrode carried by the electrode assembly, and a mechanical medium carried by the first and second remote electrodes, wherein the first and second remote electrodes are spaced apart from the workpiece holder;
   an AC power supply;
   a DC power supply; and
   a switching assembly coupled to the workpiece electrode, first remote electrode, second remote electrode, AC power supply, and the DC power supply, wherein the switching assembly includes at least three configurations comprising:
      a first configuration, wherein the DC power supply is disconnected from the workpiece electrode and the first and second remote electrodes while the AC power supply is coupled to the first and second remote electrodes;
      a second configuration, wherein the DC power supply is coupled to the workpiece electrode and both the first and second remote electrodes while the AC power supply is disconnected from the first and second remote electrodes;
      a third configuration, wherein the DC power supply is coupled to the workpiece electrode and both the first and second remote electrodes while simultaneously the AC power supply is coupled to the first and second remote electrodes.

37. An apparatus for electrochemical-mechanical processing of microelectronic workpieces, comprising:
   a workpiece holder configured to receive a microelectronic workpiece;
   a workpiece electrode carried by the workpiece holder, the workpiece electrode being configured to contact a processing side of the workpiece when the workpiece is received in the workpiece holder;
   a material removal device including an electrode assembly facing the workpiece holder, a first remote electrode carried by the electrode assembly, a second remote electrode carried by the electrode assembly, and a mechanical medium carried by the first and second remote electrodes, wherein the electrode assembly is moveable to move the first and second remote electrodes relative to the workpiece holder;
   an AC power supply;
   a DC power supply; and
   a switching assembly coupled to the workpiece electrode, first remote electrode, second remote electrode, AC power supply, and the DC power supply, wherein the switching assembly includes at least two configurations comprising:
      a first configuration, wherein the DC power supply is coupled to the workpiece electrode and the first remote electrode while the AC power supply is coupled to the first and second remote electrodes;
      a second configuration, wherein the DC power supply is coupled to the workpiece electrode and the second remote electrode while simultaneously the AC power supply is coupled to the first and second remote electrodes.

38. A method of electrochemical-mechanical processing of microelectronic workpieces, comprising:
   contacting a processing side of a microelectronic workpiece with an electrolytic solution;
   applying a direct electrical current to a workpiece electrode contacting the processing side of the workpiece and a first remote electrode spaced apart from the processing side of the workpiece, the workpiece electrode and the first remote electrode being in electrical communication with the electrolytic solution;

applying an alternating current to the first and second remote electrodes, also spaced apart from the processing side of the workpiece, thereby forming a closed circuit, the first and second remote electrodes being in electrical communication with the electrolytic solution; and contacting the processing side of the workpiece with a mechanical medium at least while applying the alternating current to the first and second remote electrodes.

39. A method of electrochemical-mechanical processing of microelectronic workpieces, comprising:

contacting a processing side of a microelectronic workpiece with an electrolytic solution;

applying a direct electrical current to a workpiece electrode contacting the processing side of the workpiece and at least one of a first remote electrode and/or a second remote electrode spaced apart from the processing side of the workpiece, the workpiece electrode, the first remote electrode, and the second remote electrode being in electrical communication with the electrolytic solution;

applying an alternating current to the first and second remote electrodes forming a closed circuit; and contacting the processing side of the workpiece with a mechanical medium at least while applying the alternating current to the first and second remote electrodes.

40. A method of electrochemical-mechanical processing of microelectronic workpieces, comprising:

contacting a processing side of a microelectronic workpiece with an electrolytic solution;

applying a direct electrical current to a workpiece electrode in contact with the processing side of the workpiece and at least one of a first remote electrode and/or a second remote electrode, wherein the workpiece electrode, the first remote electrode, and the second remote electrode are in electrical communication with the electrolytic solution; and applying an alternating current to the first and second remote electrodes thereby forming a closed circuit, while applying the direct current to the workpiece electrode and at least one of the first remote electrode and/or a second remote electrode.

41. A method of electrochemical-mechanical processing of microelectronic workpieces, comprising:

contacting a processing side of a microelectronic workpiece with an electrolytic solution;

applying a direct electrical current to a workpiece with an electrolytic solution;

applying a direct electrical current to a workpiece electrode contacting the processing side of the workpiece and at least one of a first remote electrode and a second remote electrode spaced apart from the processing side of the workpiece, and simultaneously applying an alternating current to the first and second remote electrodes thereby forming a closed circuit, wherein the workpiece electrode, the first remote electrode, and the second remote electrode are in electrical communication with the electrolytic solution;

moving at least one of the microelectronic workpiece and/or the first and second remote electrodes relative to each other while applying the direct current and the alternating current so that the first and second remote electrodes have a higher dwell time at a first region of the workpiece than at a second region of the workpiece.

42. A method of electrochemical-mechanical processing of microelectronic workpieces, comprising:

contacting a processing side of a microelectronic workpiece with an electrolytic solution;

applying a direct electrical current to a workpiece electrode that is in contact with the processing side of the workpiece and at least one of a first remote electrode and a second remote electrode, the workpiece electrode, the first remote electrode and simultaneously applying an alternating current to the first and second remote electrodes forming a closed circuit, wherein the second remote electrode are in electrical communication with the electrolytic solution;

moving at least one of the microelectronic workpiece and/or the first and second remote electrodes relative to each other while applying the direct current and the alternating current so that the first and second remote electrodes have a higher dwell time at regions of the workpiece having a thicker layer of a plated material.

* * * * *

UNITED STATES PATENT AND TRADEMARK OFFICE
CERTIFICATE OF CORRECTION

PATENT NO. : 7,153,410 B2  
APPLICATION NO. : 10/090869  
DATED : December 26, 2006  
INVENTOR(S) : Moore et al.

Page 1 of 1

It is certified that error appears in the above-identified patent and that said Letters Patent is hereby corrected as shown below:

Column 3
Line 3, "is that is, too" should be --is that it, too--;
Line 22, "specially" should be --specifically--;

Column 4
Line 34, "computer-operate" should be --computer-operable--;

Column 7
Line 20, "depict" should be --deposit--;

Column 8
Line 6, "effected" should be --effectuated--;

Column 15 Claim 11
Line 36, "mechanism" should be --mechanical--;

Column 18 Claim 32
Line 39, "electrolyte" should be --electrolytic--;
Line 49, "(d)" should be --(b)--;

Signed and Sealed this

Seventeenth Day of July, 2007

JON W. DUDAS
*Director of the United States Patent and Trademark Office*